United States Patent
Inoue et al.

(10) Patent No.: US 8,605,249 B2
(45) Date of Patent: *Dec. 10, 2013

(54) EXPOSURE APPARATUS, EXPOSURE METHOD, AND DEVICE MANUFACTURING METHOD

(75) Inventors: Hideya Inoue, Kanagawa (JP); Tohru Kiuchi, Tokyo (JP)

(73) Assignee: Nikon Corporation, Tokyo (JP)

( * ) Notice: Subject to any disclaimer, the term of this patent is extended or adjusted under 35 U.S.C. 154(b) by 290 days.

This patent is subject to a terminal disclaimer.

(21) Appl. No.: 12/494,937

(22) Filed: Jun. 30, 2009

(65) Prior Publication Data

US 2009/0263736 A1    Oct. 22, 2009

Related U.S. Application Data

(60) Division of application No. 12/120,838, filed on May 15, 2008, which is a continuation of application No. PCT/JP2006/322716, filed on Nov. 15, 2006.

(30) Foreign Application Priority Data

Nov. 15, 2005  (JP) ................................ 2005-330839

(51) Int. Cl.
G03B 27/68  (2006.01)

(52) U.S. Cl.
USPC .......................................................... 355/52

(58) Field of Classification Search
USPC .................................... 355/52, 67, 71, 74, 77
See application file for complete search history.

(56) References Cited

U.S. PATENT DOCUMENTS

| 5,546,225 | A  | 8/1996  | Shiraishi |
| 5,633,721 | A  | 5/1997  | Mizutani |
| 5,969,441 | A  | 10/1999 | Loopstra et al. |
| 6,208,407 | B1 | 3/2001  | Loopstra |
| 6,532,097 | B1 | 3/2003  | Allen et al. |
| 6,590,634 | B1 | 7/2003  | Nishi et al. |
| 6,611,316 | B2 | 8/2003  | Sewell |
| 6,897,963 | B1 | 5/2005  | Tanigushi et al. |
| 6,952,253 | B2 | 10/2005 | Lof et al. |

(Continued)

FOREIGN PATENT DOCUMENTS

| EP | 1420298     | 5/2004 |
| JP | 05-129182 A | 5/1993 |

(Continued)

OTHER PUBLICATIONS

Notification of Reasons for Refusal issued in Japanese Application No. 2007-545252 issued Jun. 1, 2011.

(Continued)

*Primary Examiner* — Glen Kao

(74) *Attorney, Agent, or Firm* — Miles & Stockbridge P.C.

(57) ABSTRACT

A pattern image generation device generates a pattern image, and at least a part of the pattern image which has been generated or the pattern image which is generated and is formed on an object is photoelectrically detected by a detection system. Then, a correction device corrects design data that should be input to the pattern image generation device based on the detection results. Accordingly, a pattern image is generated on an object by the pattern image generation device corresponding to the input of the design data after the correction, and because the object is exposed using the pattern image, a desired pattern is formed on the object with good precision.

12 Claims, 6 Drawing Sheets

(56) References Cited

U.S. PATENT DOCUMENTS

| | | |
|---|---|---|
| 6,961,115 B2 | 11/2005 | Hamatani et al. |
| 7,023,610 B2 | 4/2006 | Ohtsuki et al. |
| 7,573,052 B2 * | 8/2009 | Inoue et al. ............. 250/492.22 |
| 2001/0021014 A1 * | 9/2001 | Tamada et al. ............ 356/237.2 |
| 2002/0041377 A1 | 4/2002 | Hagiwara et al. |
| 2004/0075882 A1 | 4/2004 | Meisburger |
| 2005/0145805 A1 | 7/2005 | Hoefnagels et al. |
| 2005/0179884 A1 | 8/2005 | Gui et al. |
| 2005/0195380 A1 | 9/2005 | Sytsma et al. |
| 2005/0243295 A1 | 11/2005 | de Jager et al. |
| 2005/0243298 A1 | 11/2005 | de Jager et al. |
| 2005/0243397 A1 | 11/2005 | Latypov |
| 2006/0285100 A1 | 12/2006 | Hamatani et al. |
| 2008/0299492 A1 | 12/2008 | Kiuchi et al. |

FOREIGN PATENT DOCUMENTS

| | | |
|---|---|---|
| JP | 10-163099 | 6/1998 |
| JP | 10-214783 | 8/1998 |
| JP | 11-135400 | 5/1999 |
| JP | 2000-164504 | 6/2000 |
| JP | 2002-195912 A | 7/2002 |
| JP | 2004-200536 A | 7/2004 |
| JP | 2004-289126 | 10/2004 |
| JP | 2004-304135 | 10/2004 |
| JP | 2004-319899 | 11/2004 |
| JP | 2004-327660 | 11/2004 |
| JP | 2005-005521 A | 1/2005 |
| JP | 2005-158784 A | 6/2005 |
| JP | 2005-173563 | 6/2005 |
| JP | 2005-302826 A | 10/2005 |
| TW | 200532395 A | 1/2005 |
| TW | 200535587 A | 11/2005 |
| WO | WO 99/23692 | 5/1999 |
| WO | WO 99/46835 | 9/1999 |
| WO | WO 99/49504 | 9/1999 |
| WO | WO 2004/032000 A1 | 4/2004 |
| WO | WO 2004/055803 | 7/2004 |
| WO | WO 2005/096098 A2 | 10/2005 |

OTHER PUBLICATIONS

Notification of Reasons for Refusal issued May 10, 2012 in Japanese Application No. 2007-545252.

Decision of Refusal dated Sep. 14, 2012 in corresponding Japanese Application No. 2007-545252.

Office Action issued Jan. 16, 2013, in Taiwan Patent Application No. 095142353 (with Translation of the Preliminary Examination Report).

* cited by examiner

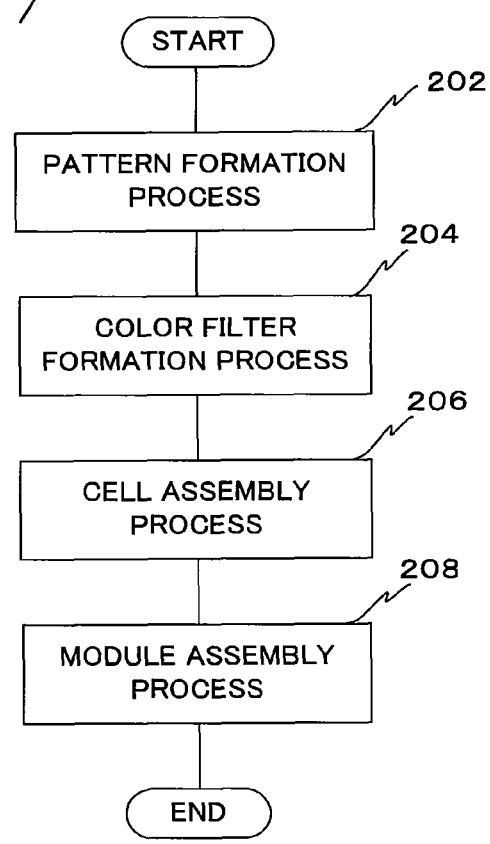

EXPOSURE APPARATUS, EXPOSURE METHOD, AND DEVICE MANUFACTURING METHOD

CROSS-REFERENCE TO RELATED APPLICATION

This application is a divisional application of application Ser. No. 12/120,838 filed May 15, 2008, which is a continuation of International Application PCT/JP2006/322716, with an international filing date of Nov. 15, 2006, the disclosure of which is hereby incorporated by reference in its entirety, which was not published in English.

BACKGROUND OF THE INVENTION

1. Field of the Invention

The present invention relates to exposure apparatus, exposure methods, and device manufacturing methods, and more particularly to an exposure apparatus and an exposure method used in a lithography process to produce electronic devices such as a semiconductor device and a liquid crystal display device, and a device manufacturing method that uses the exposure apparatus and the exposure method.

2. Description of the Background Art

Conventionally, in a lithographic process to produce electronic devices (microdevices) such as a semiconductor or a liquid crystal display device, a projection exposure apparatus by a step-and-repeat method (the so-called stepper) that transfers a pattern formed on a mask (a reticle, a photomask or the like) onto a plate (a glass plate, a wafer or the like) on which a sensitive agent such as a resist is coated via a projection optical system, or a projection exposure apparatus by a step-and-scan method and the like is used.

Now, in recent years, a maskless type (without the use of a mask which is a fixed original plate) scanning projection exposure apparatus has been proposed that can form a device without using an expensive mask, regardless of the size (degree of fineness such as, for example, linewidth, pitch and the like) of the device pattern (for example, refer to Kokai (Japanese Patent Unexamined Application Publication) No. 2004-327660 bulletin). According to the scanning projection exposure apparatus described in Kokai (Japanese Patent Unexamined Application Publication) No. 2004-327660 bulletin, by changing a transfer pattern generated in a variable pattern generation device in synchronous with the substrate stage, a desired pattern can be generated easily. Furthermore, because the exposure apparatus does not have to be equipped with a mask stage, which is different from a conventional exposure apparatus using a mask, it becomes possible to reduce the cost and size of the exposure apparatus.

However, it has become clear recently that even when the exposure apparatus is the maskless type described above, or in other words, the variable forming mask (also called an active mask or an image generator) on which a variable pattern is formed is used, it is actually not easy to obtain a pattern image of a desired shape and size, needles to say in the case of a transmission type, but also in the case of a reflection type. The cause for this is considered to be the influence of various optical phenomena, such as for example, optical proximity effect (OPE) or the so-called flare, or aberration of the optical system on image formation of a pattern generated by the variable forming mask on a surface subject to exposure via an optical system, even in the case when the variable forming mask is used.

SUMMARY OF THE INVENTION

The present invention has been made in consideration of the circumstances described above, and according to the first aspect of the present invention, there is provided a first exposure apparatus that exposes an object with a pattern image, the apparatus comprising: a pattern image generation device which generates a pattern image corresponding to an input of a design data; a detection system which photoelectrically detects at least a part of the pattern image that has been generated or a pattern image generated and formed on the object; and a correction device which corrects the design data that should be input to the pattern image generation device based on results of the detection.

According to this apparatus, at least a part of a pattern image generated by a pattern image generation device or a pattern image which is generated and formed on an object photoelectrically detected by the detection system. Then, the correction device corrects design data that should be input to the pattern image generation device based on results of the detection. Accordingly, a pattern image is generated on an object by the pattern image generation device corresponding to the input of the design data after the correction, and because the object is exposed using the pattern image, a desired pattern is formed on the object with good precision.

According to a second aspect of the present invention, there is provided a second exposure apparatus, the apparatus comprising: a second exposure apparatus that exposes an object with a pattern image, the apparatus comprising: a pattern image generation device which generates a pattern image via a variable shaped mask that spatially modulates at least one of an amplitude, a phase, and a state of polarization of light according to the input of the design data; a detection system which photoelectrically detects at least a part of the pattern image that has been generated or a pattern image generated and formed on the object; and a controller which detects an operation state of the variable shaped mask based on the detection results.

According to the apparatus, an operation state of the variable shaped mask installed in the exposure apparatus can be easily confirmed, and the pattern can be formed on the object using variable shaped mask with good precision.

According to a third aspect of the present invention, there is provided a device manufacturing method including a lithography process in which an object is exposed using any one of the first and second exposure apparatus in the present invention.

According to a fourth aspect of the present invention, there is provided a first exposure method in which an object is exposed with a pattern image generated according to an input of design data, the method comprising: detecting a pattern image generated corresponding to the design data or a pattern image which is generated and is formed on the object and correcting the design data according to results of the detection, and using the corrected design data is used to generate a pattern image at the time of exposure of the object.

According to a fifth aspect of the present invention, there is provided a second exposure method in which an object is exposed with a pattern image, the method comprising: detecting a pattern image generated via a variable shaped mask or a pattern image which is generated and is formed on the object according to the input of design data, and detecting an operation state of the variable shaped mask based on results of the detection.

According to a sixth aspect of the present invention, there is provided a device manufacturing method including a lithography process in which an object is exposed using one of the first and second exposure methods of the present invention.

BRIEF DESCRIPTION OF THE DRAWINGS

In the accompanying drawings;

FIG. 7 is a flow chart for explaining a device manufacturing method of a liquid crystal display device which serves as a micro device.

DESCRIPTION OF THE EMBODIMENTS

A First Embodiment

Figure 1:
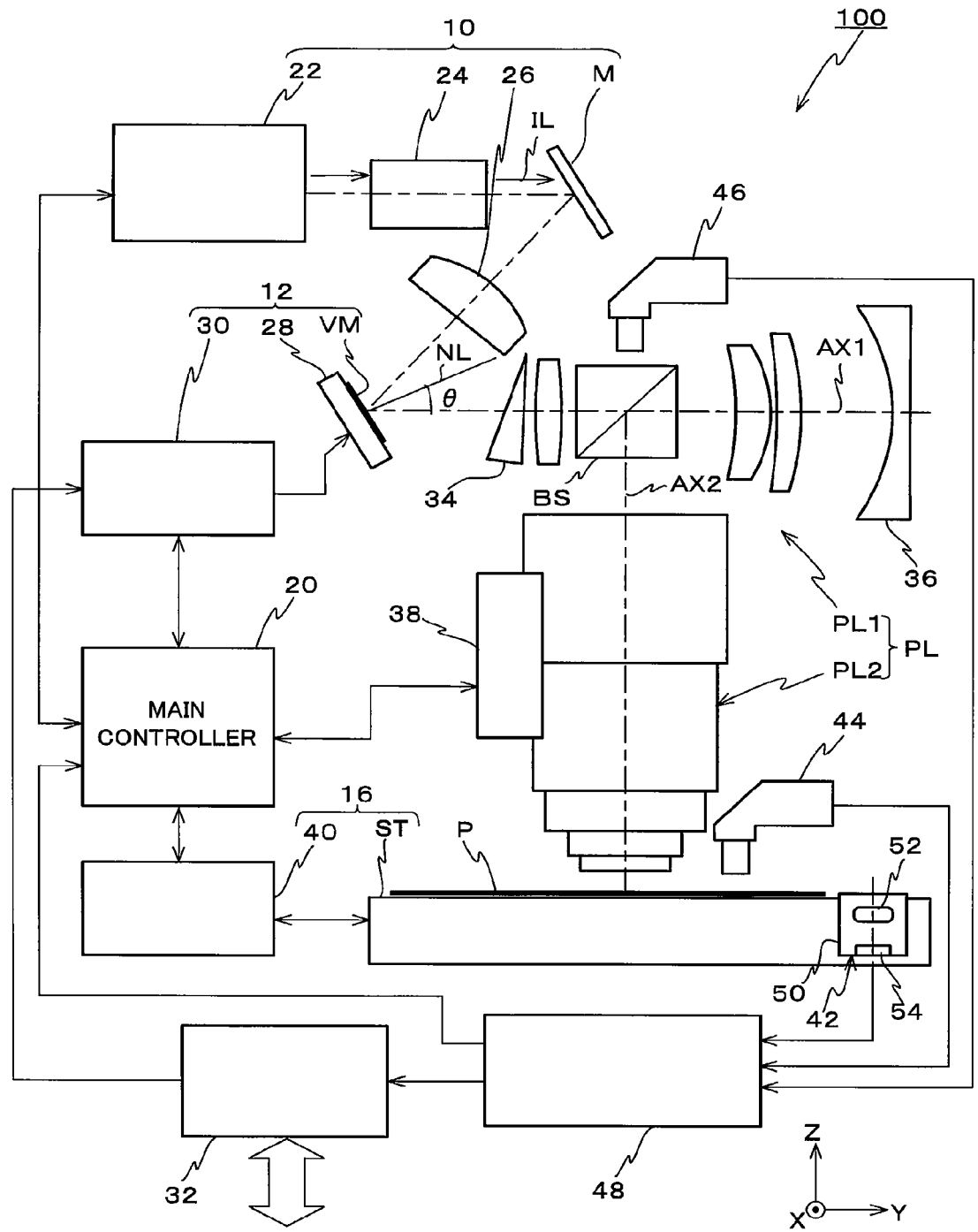
FIG. 1 is a view that schematically shows a configuration of an exposure apparatus related to a first embodiment.

A first embodiment of the present invention will be described below, with reference to FIGS. 1 to 4. FIG. 1 schematically shows a configuration of an exposure apparatus 100 related to the first embodiment.

Exposure apparatus 100 is equipped with an illumination system 10, a mask device 12, a projection optical system PL, a stage unit 16, a control system controlling these sections and the like. Exposure apparatus 100 performs exposure processing by projecting a pattern image of a reflection type variable forming mask (an electronic mask) VM which constitutes a part of mask device 12 on a plate (photosensitive substrate) P mounted on a stage ST which constitutes a part of stage device 16. The control system includes a microcomputer, and is mainly configured of a main controller 20 which has overall control over the entire apparatus. Further, exposure apparatus 100 is a scanning exposure apparatus that forms a pattern on plate P by synchronizing switching (change) of a generation pattern by variable forming mask VM and movement of plate P.

Illumination system 10 performs even illumination on variable forming mask VM with an illumination light IL, and is equipped with a light source system 22 including a light source and a light source control system (none of which are shown), an illumination optical system 24, a mirror M, a condensing lens 26 and the like. Illumination optical system 24 includes a forming optical system having variable illumination conditions, an optical integrator (illuminance uniformity member), a field stop, a relay lens and the like (none of which are shown), and in the description below, mirror M and condensing lens 26 will also be included in the system.

Now, as an example, a KrF excimer laser which emits a laser beam having a wavelength of 248 nm will be used as the light source. Incidentally, as the light source, instead of the KrF excimer laser, an extra-high pressure mercury lamp outputting a line spectrum (g-line, i line) in the ultraviolet region, or a harmonic generating device such as a semiconductor laser whose details are disclosed in, for example, the pamphlet of International Publication No. 1999/46835 and the corresponding U.S. Pat. No. 7,023,610 description can be used, not to mention an ArF excimer laser having an output wavelength of 193 nm.

Further, for example, the forming optical system is placed at the incidence side of the optical integrator in illumination optical system 24 and has a plurality of optical elements including a switchable diffractive optical element, a movable prism, a zoom optical system, a polarization member and the like, and by the exchange or movement of at least one optical element, intensity distribution (shape and/or magnitude of a secondary light source) of illumination light IL on the pupil plane of illumination optical system 24, or in other words, illumination conditions of variable forming mask VM are changed. As the optical integrator, for example, a fly-eye lens is used; however, an internal reflection type integrator, a diffractive optical element or the like can also be used.

Illumination optical system 24 irradiates illumination light IL outgoing from a secondary light source (a plane light source consisting of many light source images) formed on a focal plane on the rear side of the fly-eye lens (pupil plane of illumination optical system 24) on variable forming mask VM. More specifically, Koehler illumination of a wavefront division type is performed. Further, illumination optical system 24 can make illumination conditions such as, for example, coherence factor (σ value: ratio of the numerical aperture of the illumination beam from the secondary light source with respect to the numerical aperture on the mask side of the projection optical system) vary continuously by the forming optical system.

Mask device 12 is an electronic mask system which generates a variable pattern that should be projected on plate P mounted on stage ST, and is equipped with variable forming mask VM, a mask holder 28 that supports (holds) variable forming mask VM, and a mask drive system 30 which controls the operating state of variable forming mask VM.

In this case, for example, variable forming mask VM includes a DMD (Deformable Micro-mirror Device or Digital Micro-mirror Device) which is a kind of a non-emission type image display device (a spatial light modulator: also called Spatial Light Modulator (SLM)), and spatially modulates the intensity (the amplitude) of the incoming light to projection optical system PL by reflecting/deflecting the incoming light by a device unit arranged two-dimensionally.

Mask holder 28 can adjust the attitude of variable shaped mask VM held by mask holder 28 with respect to projection optical system PL. More specifically, variable shaped mask VM is movable two-dimensionally by mask holder 28 in a plane in which a direction that forms an angle θ within an YZ plane with respect to a first optical axis AX1 of projection optical system PL parallel to a Y-axis direction in FIG. 1 serves as a normal direction, and variable shaped mask VM is also rotatable around a normal line NL intersecting the first optical axis AX1, and furthermore, can be movable along normal line NL, and/or can be tiltable with respect to a plane of normal line NL. On such movement, the position of the variable shaped mask VM is measured, for example, by a measurement device (not shown) (a laser interferometer and/or an encoder) which measures a position of mask holder 28, and the positional information that has been measured is supplied to mask drive system 30.

Mask drive system 30 adjusts the position of the variable shaped mask VM, based on the positional information that has been measured. Further, mask drive system 30 can make variable shaped mask VM perform a display operation, based on command and data output from a pattern data generation device 32. To be concrete, based on an image or pattern information which is to be generated in variable shaped mask VM, an attitude of each micro mirror arranged by a pixel unit in the shape of a two-dimensional matrix on the surface of variable shaped mask VM is electronically controlled via a drive section arranged in each micro mirror. According to this control, each micro mirror performs a binary behavior between an ON state where illumination light IL is guided to the exposure optical path and is incident on projection optical system PL and an OFF state where illumination light IL is guided to a non-exposure optical path and so that illumination light IL is not incident on projection optical system PL, and generates a desired reflection pattern in at least a part of variable shaped mask VM. Incidentally, mask drive system 30 can change the display pattern that should be generated in variable shaped mask VM, based on the pattern information which is sequentially output from pattern data generation unit 32. Accordingly, the pattern generated in variable shaped mask VM can be changed appropriately, in synchronization with the movement of plate P mounted on stage ST.

Projection optical system PL includes a first partial optical system PL1 including a wedge-shaped optical element 34, a beam splitter BS, a concave mirror 36, a plurality of lenses and the like and having a first parallel optical axis AX1 which is parallel to the Y-axis direction, and a second partial optical system PL2 sharing beam splitter BS with the first partial optical system PL1 and having a second optical axis AX2 parallel to the Z-axis direction. The second partial optical system PL2 is a dioptric system that has a plurality of lens elements arranged along the second optical axis AX2 inside the barrel. Projection optical system PL, as a whole, is an image side telecentric catodioptric system, reduces and projects a pattern of variable shaped mask VM illuminated by illumination light IL on plate P placed on the surface subject to exposure (image plane) at a projection magnification β (β is, for example, 1/500).

Wedge-shaped optical element 34 is arranged, taking into consideration that the surface of variable shaped mask VM is inclined toward the optical axes of both illumination optical system 24 and projection optical system PL. More specifically, optical element 34 makes a swing angle which is approximately zero of a light reflected by variable shaped mask VM with respect to the first optical axis AX1 of projection optical system PL.

In projection optical system PL, an image-forming characteristic correction device 38 is arranged which moves at least one of the optical elements of projection optical system PL such as, for example, at least one lens element of the second partial optical system PL2 along the second optical axis AX2, and also applies an inclination drive to an XY plane orthogonal to the second optical axis AX2. While image-forming characteristic correction device 38 adjusts the image-forming state (image-forming characteristics of projection optical system PL) of a pattern image generated on plate P via projection optical system PL, instead of moving the optical elements of projection optical system PL, or in combination with the method, other methods such as adjusting wavelength characteristics (center wavelength, spectral width and the like) of illumination light IL by controlling light source system 22 can also be employed.

Stage device 16 is equipped with stage ST which is movable holding plate (e.g., a glass substrate, a semiconductor wafer and the like) P serving as an object subject to exposure, and a stage drive system 40 which controls an operation state (such as movement) of stage ST according to a command from main controller 20.

Stage ST is movable in an X-axis, the Y-axis, and the Z-axis direction and is also rotatable in rotational (θX, θY, θZ) directions around the X-axis, the Y-axis, and the Z-axis, and can align plate P with respect to the pattern image of variable shaped mask VM generated via projection optical system PL in six degrees of freedom. Furthermore, in order to perform scanning exposure of plate P with illumination light IL via variable shaped mask VM and projection optical system PL, stage ST is moved in a predetermined scanning direction (for example, the Y-axis direction which is the horizontal direction of the page surface in FIG. 1) in the XY plane at a desired speed so that a change of the pattern (display image) generated in variable shaped mask VM and the movement of plate P are synchronized.

The positional information (also including rotation information) of stage ST is measured by a position measurement system (not shown) (for example, including a laser interferometer and/or an encoder, and focus sensors and the like if necessary), and is supplied to main controller 20. Based on the positional information, main controller 20 drives a motor and the like of stage drive system 40, and moves and sets the position of plate P.

Main controller 20 controls the operation of illumination system 10, mask device 12, stage device 16 and the like, and forms the image of the pattern sequentially generated in variable shaped mask VM on plate P via projection optical system PL. In doing so, main controller 20 performs a scanning type exposure while moving plate P at a suitable speed, and scrolling the pattern generated in variable shaped mask VM via mask drive system 30 in synchronization with the movement of plate P.

In this case, when scanning speed of stage ST holding plate P is to be V1, display speed V2 in the scanning direction of the pattern, which is displayed in variable shaped mask VM, is:

$$V2=V1/\beta.$$

Accordingly, in the embodiment where projection magnification β of projection optical system PL is 1/500, display speed V2 in the scanning direction of the pattern of the variable shaped mask VM is to be a speed 500 times the speed of speed V1 of stage ST.

As other constituents, exposure apparatus 100 is equipped with an image detector 42 arranged on stage ST, pattern detection systems (microscopes) 44 and 46, for example, by an image processing method that detect the pattern formed on plate P, a signal processing system 48 which processes the signals which are output from image detector 42 and pattern detection systems 44 and 46, respectively, pattern data generation unit 32 and the like. Incidentally, pattern detection systems 44 and 46 are by an off-axis method and a TTL method, respectively.

Image detector 42 has a housing 50 arranged on stage ST, a lens system 52 and a CCD two-dimensional image sensor 54 placed inside housing 50. The upper wall of housing 50 is a glass plate whose upper surface (surface) is to be the photodetection surface of image detector 42. The upper surface of the glass plate is substantially flush with the upper surface (surface) of plate P, and as to projection optical system PL, the upper surface is also in an optically conjugate relation with the surface of variable forming mask VM. Further, the upper surface of the glass plate and the imaging plane of CCD two-dimensional image sensor 54 are in an optically conjugate relation via lens system 52. Accordingly, when the photodetection surface of image detector 42 is placed in a projection area (an irradiation area of illumination light IL) of projection optical system PL, at least a part of an image of a pattern generated in variable forming mask VM via projection optical system PL and lens system 52 is formed on CCD two-dimensional image sensor 54, and the image is photoelectrically detected by CCD two-dimensional image sensor 54. Image detector 42 supplies a signal corresponding to light intensity distribution of the pattern image to signal processing system 48. Incidentally, a part of image detector 42, such as, for example, the CCD image sensor, can be placed external to stage ST, and in such a case, image detector 42 can connect to lens system 52 via a light guide or a relay optical system.

Pattern detection system 44 includes an object lens (not shown), and a CCD two-dimensional image sensor (not shown) placed on a surface optically conjugate with a plate P surface via the object lens. Pattern detection system 44 picks up a pattern image (a latent image) formed on a resist layer on plate P after going through an exposure process, and/or a part of a pattern image (a resist image) or the whole pattern image formed on plate P after going through exposure and development process, and then supplies the imaging signals to signal processing system 48.

Pattern detection system 46 includes an object lens and CCD two-dimensional image sensor (both of which are not shown). The CCD two-dimensional image sensor is placed on a surface optically conjugate with the plate P surface via an optical system consisting of a beam splitter BS, the second partial optical system PL2, and an object lens. Similar to pattern detection system 44, pattern detection system 46 picks up a part of or the whole latent image and/or a resist image on plate P, and the imaging signals are supplied to signal processing system 48. Further, pattern detection system 46 can pick up at least a part of an image of a pattern generated invariable forming mask VM via a reflection surface (a surface of a member having a high reflectance such as, for example, a reflecting plate) on stage ST and the optical system. Incidentally, pattern detection systems 44 and 46 can each detect not only the latent image and the resist image referred to above, but also a mark (for example, an alignment mark of plate P) on stage ST.

Of the data necessary to form a pattern image, pattern data generation device 32 reads design data (CAD data) of a pattern from an upper device (not shown) consisting of a work station and the like. Further, pattern data generation device 32 computes a mask pattern (equivalent to the pattern that should be formed on plate P) which is the basic pattern that should be generated in variable forming mask VM, based on the CAD data of the pattern. In this mask pattern, scrolling is designed on the occasion of scanning exposure, which serves as a display data showing a temporal frame advance. In this case, main controller 20 decides the scroll speed (display speed) of the pattern generated in variable forming mask VM as a part of a parameter used for scanning exposure which includes movement speed of plate P and the like.

Further, for example, pattern data generation device 32 communicates between main controller 20 via mask drive system 30, and main controller 20 detects a projected image (an aerial image) by projection optical system PL of a pattern generated in variable forming mask VM according to the display data (for example, a part of the mask pattern described earlier) from pattern data generation device 32, using image detector 42. Then, pattern data generation device 32 takes in and analyzes a signal corresponding to the light intensity distribution of the pattern image output from signal processing system 48 at the time of detection, and then computes the size, such as for example, linewidth, as a characteristic of the pattern image.

Signal analysis and computation (characteristic detection) of the linewidth of the pattern image by pattern data generation device 32 will now be described here.

Figure 2:
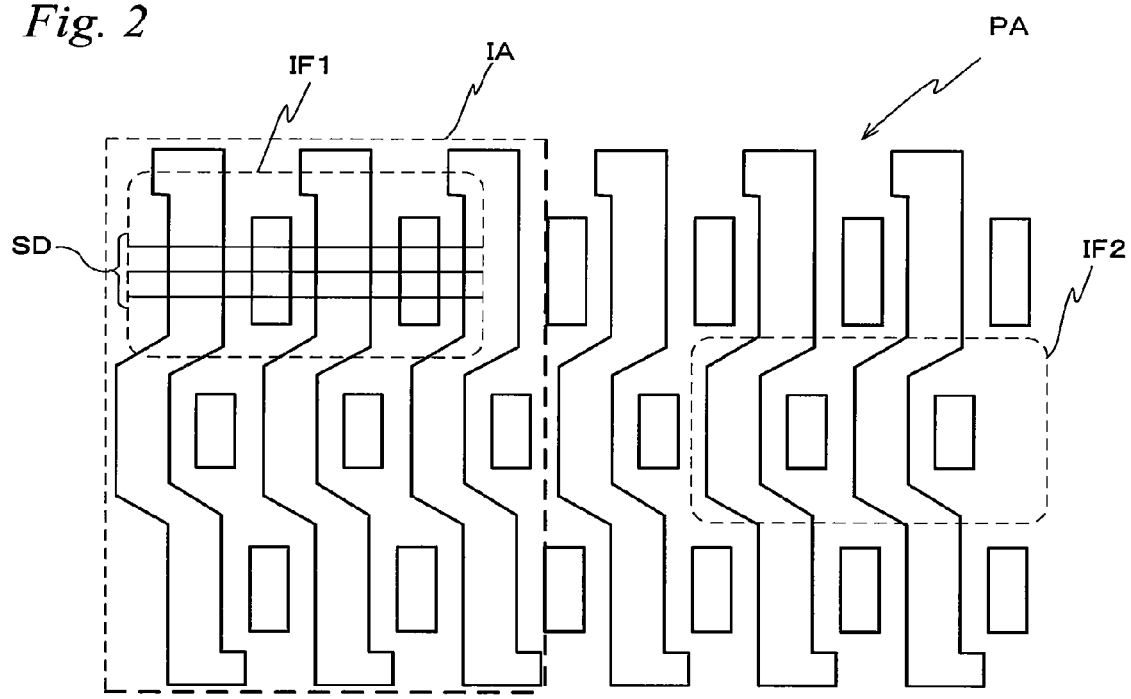
FIG. 2 is a view that shows a pattern image PA formed on a plate P, along with an exposure area, and an imaging area (a detection area) of an image detector.

FIG. 2 shows a pattern image PA formed on plate P. In FIG. 2, the area of the pattern images which can be formed at one time in variable shaped mask VM is an area shown in code IA, and area IA is none other than the exposure area (the projection area previously described). Further, the area shown in code IF1 shows an imaging area (a detection area) of image detector 42. Further, code IF2 shows an imaging area when stage ST moves and the image of a different section of pattern PA is picked up with image detector 42.

Figure 3:
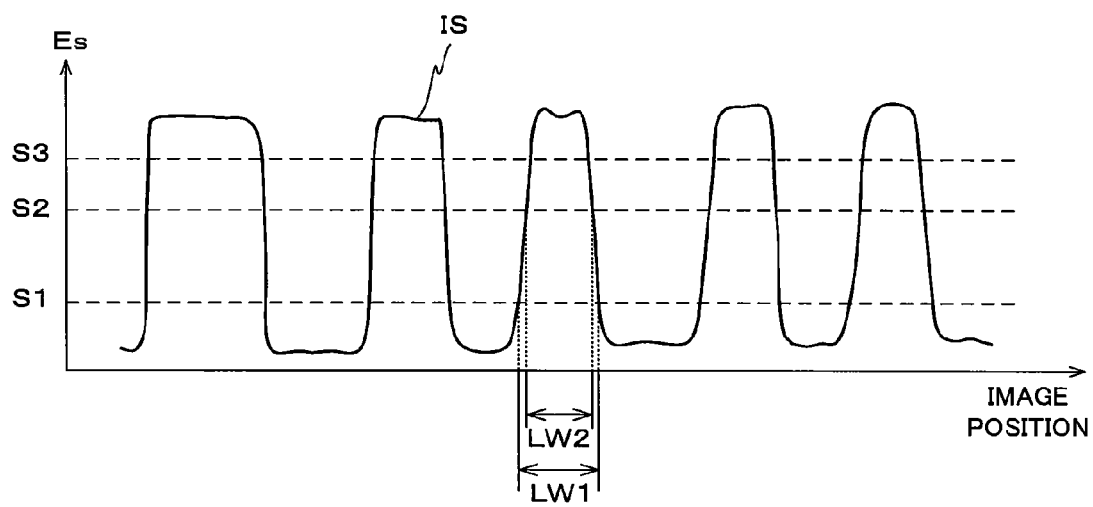
FIG. 3 is a view that shows an example of a signal corresponding to averaging of a light intensity signal (corresponding to the brightness value of the pixel row on a main scanning like) on a plurality of the main scanning lines inside the imaging area.

FIG. 3 shows an example of a signal IS corresponding to an averaging of the light intensity signal (corresponding to the brightness value of the pixel row on a main scanning line) on a plurality of the main scanning lines in a vertical scanning range shown in code SD inside imaging area IF1, with the horizontal axis showing the image position and the vertical axis showing the light intensity (energy intensity) Es. Further, in FIG. 3, codes S1, S2, and S3 show slice levels, and slice levels S1, S2, and S3 correspond to an example of the sensitivity of a resist. More specifically, based on the resist sensitivity information acquired from signal IS and the upper device, by pattern data generation device 32, for example, in the case the sensitivity of resist corresponds to slice level S2, the line width of the third line pattern image from the left is computed as LW2, and for example, in the case the sensitivity of resist corresponds to slice level S1, the line width of the line pattern image of the third space from the left is computed as LW1. Pattern data generation device 32 computes the line width of other sections of the same line pattern image and the line width of other line pattern images similarly.

Further, pattern data generation device 32 compares the line width that has been computed, for example, with the pattern line width in the pattern data (design data) supplied to mask drive system 30 at the time of projection of pattern image PA, and in the case the computed line width is thinner than the design line width, the pattern data (design data) is corrected so that the line width of pattern image PA becomes thick. Then, pattern data generation device 32 stores the pattern data after correction (or data of the correction amount) in a memory, or returns the data to the upper device. In any case, at the time of actual exposure, pattern data generation device 32 supplies the pattern data after correction to mask drive system 30.

In this case, pattern data generation device 32 can correct the pattern data (design data) described above each time detection of the pattern image is performed by image detector 42. However, besides such a correction, for example, the pattern data (design data) that should be supplied to mask drive system 30 can be corrected only in the case where a generated pattern image is analyzed based on a signal from signal processing system 48, and the quality of the generated pattern image deviates from a predetermined specification based on the analyzed result such as when, for example, the absolute value of the line width error exceeds a predetermined permissible value.

Incidentally, when pattern data generation device 32 does not correct the pattern data (design data), pattern data generation device 32 can communicate with main controller 20 via mask drive system 30, and can provide information on the line width error to main controller 20. In this case, main controller 20 changes (adjusts) the exposure conditions, based on the error information. For example, if the line width error occurs in the entire exposure area almost uniformly, the exposure amount can be controlled via light source system 22, and/or image-forming characteristics (e.g. magnification and the like) of projection optical system PL can be controlled via image-forming characteristic correction device 38. In this case, the exposure amount can be adjusted not only by changing the intensity of illumination light IL and/or the repetition frequency by light source system 22, but also by changing the scanning speed of plate P during scanning exposure or by changing the width of the projection area in the scanning direction previously described. Further, the exposure amount and/or the image-forming characteristics can also be adjusted together with the correction of the pattern data. Furthermore, instead of correcting the pattern data, or in combination with the correction, adjustment of illumination conditions of variable shaped mask VM can also be performed by the forming optical system previously described. In this case, the intensity distribution (secondary light source) of illumination light IL on the pupil plane of illumination optical system 24 can be changed into a different shape, or the shape can be substantially the same while the size (such as a c value) is changed. Further, in the case of adjusting illumination conditions, the exposure amount and/or the image-forming characteristics can also be adjusted. Incidentally, while the exposure conditions are exposure amount, image-forming characteristics, and illumination conditions, for example, it may also include numerical aperture of projection optical system PL, or implementation of super-resolution technology where the depth of focus is substantially enlarged by setting a predetermined point on the plate during scanning exposure at a serially different Z position, and the fluctuation (movement range) in the Z-axis direction.

Now, as a cause of error in the line width of the pattern image, the so-called optical proximity effect can be given besides flare of the optical system. Because the error of the line width of the pattern image by the optical proximity effect is normally uneven within the exposure area, when the line width of the pattern image in such a case is corrected, a method by the pattern data (design data) correction previously described is effective. Further, the method to correct optical proximity effect is called optical proximity correction (OPC: Optical Proximity Correction). As a type of the OPC, a method that uses an auxiliary pattern is known. The OPC using an auxiliary pattern will now be briefly described. When taking a line-and-space pattern as an example, because no patterns are formed on one side (the outer side) of the line patterns located on both ends in the periodic direction, the quantity of light that comes from around the one side is more than other line patterns, which consequently makes the line width of the resist image of the line patterns located on both ends that are formed into a positive resist become thinner when compared with the line width of the resist image of other line patterns. In order to prevent such a phenomenon, the OPC is a technique where dummy patterns (auxiliary patterns) which are so narrow that their images cannot be formed, or more specifically, equal to or less than the limit of resolution of projection optical system PL are placed on the outer side of the line patterns located on both ends in the periodic direction, and by the presence of these dummy patterns, the quantity of light that comes from around described above is reduced so that the line width of the resist image of all the line patterns are made to be the same as the design line width. The method of the embodiment is effective even in the OPC using the auxiliary pattern.

Figure 4:
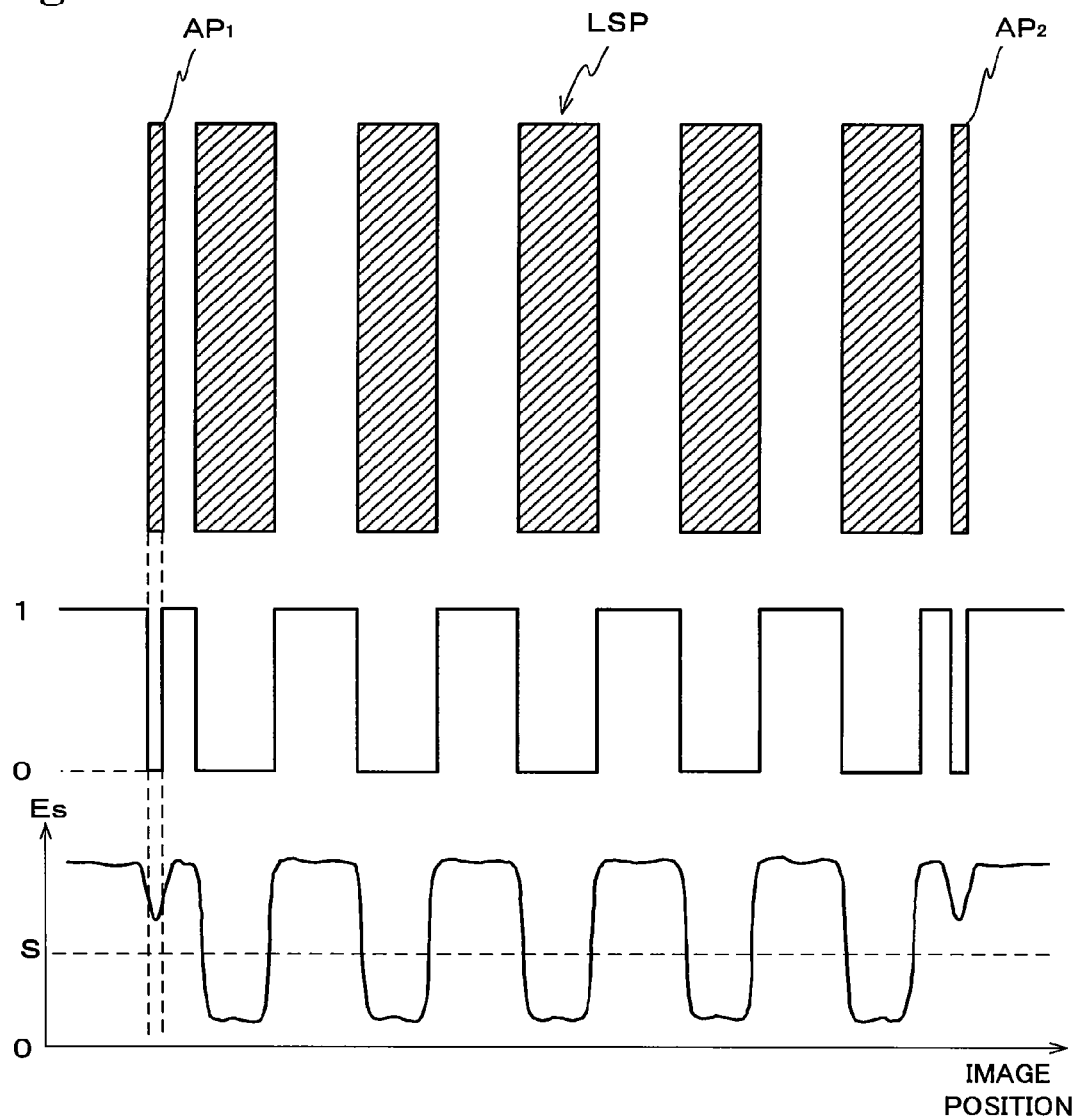
FIG. 4 is a view that shows a line-and-space pattern LSP which has a pair of auxiliary patterns $AP_1$ and $AP_2$ placed at both ends in the periodic direction, design light intensity signal corresponding to the pattern, and the light intensity signal of the image of line-and-space pattern LSP and auxiliary patterns $AP_1$ and $AP_2$ on the main scanning line that have actually been detected.

The upper section of FIG. 4 shows a line-and-space pattern LSP having a pair of auxiliary patterns $AP_1$ and $AP_2$ placed on both ends in the periodic direction. Further, the middle section of FIG. 4 shows a design light intensity (energy intensity) signal corresponding to the pattern shown in the section above, and the lower section of FIG. 4 shows the light intensity (energy intensity) signal (corresponding to the brightness value of the pixel row on the main scanning line) of the image of line-and-space pattern LSP and auxiliary patterns $AP_1$ and $AP_2$ on the main scanning line that have actually been detected.

Therefore, when pattern data generation device 32 acquires the signal shown in the lower section of FIG. 4, pattern data generation device 32 performs the analysis and line width computation previously described based on the signal and slice level S, and by comparing, for example, the line width of the two line pattern images on both ends and the line width (in this case, to be the same as the design line width) of other line pattern images, the line width error of the line pattern image on both ends is computed. Then, at least one of the line width and the position in the design data of auxiliary patterns $AP_1$ and $AP_2$ can be corrected according to the computation results, so that the line width of all the line pattern images become almost equal.

According to exposure apparatus 10 related to the first embodiment, prior to exposure, pattern data generation device 32 corrects the design data of the pattern based on the detection results of image detector 42 in the manner previously described, and the design data of the pattern after correction is output to mask drive system 30 from pattern data generation device 32. Mask drive system 30 individually performs the ON/OFF operation of each micro mirror of variable shaped mask VM, corresponding (responding) to the input of the design data. When variable shaped mask VM is illuminated uniformly by illumination light IL from illumination system 10 in this state, a reflection pattern according to the design data is generated. Then, the beam including the information of the pattern generated in variable shaped mask VM generates the image of the pattern on plate P via projection optical system PL. Then, by scrolling a pattern generated in variable shaped mask VM synchronously while scanning plate P in the Y-axis direction, a desired pattern is formed gradually on plate P. In this manner, a pattern image such as, for example, pattern image PA previously described, is formed on plate P.

As discussed above according to exposure apparatus 100 related to the first embodiment, in prior to the exposure of the plate, in response to the input of the design data (pattern data) from pattern data generation device 32, mask drive system 30 individually performs the ON/OFF operation of each micro mirror of variable shaped mask VM, and variable shaped mask VM is also illuminated by illumination light IL from illumination system 10 and the image of the pattern generated in variable shaped mask VM is generated by projection optical system PL, and at least a part of the pattern image which has been generated is photoelectrically detected by image detector 42. Then, pattern data generation device 32 analyzes the pattern image that has been generated based on a signal from signal processing system 48 which processes a signal of image detector 42, and corrects the design data that should be supplied (input) to mask device 12 according to the analyzed results. In this case, pattern data generation device 32 corrects the design data above so that at least a part of the size of the pattern image formed on the image plane of projection optical system PL, such as, for example, the line width, is changed.

Accordingly, on exposure of the plate, the design data after correction is supplied (input) to mask device 12, and in response to the input, a pattern image is generated on plate P by mask device 12, illumination system 10, and projection optical system PL similar to the description above, and because plate P is exposed using the pattern image, a desired pattern is formed on plate P with good precision.

Incidentally, in the embodiment above, pattern data generation device 32 analyzed the pattern image based on the detection signal of image detector 42, which detects the projected image of the pattern formed by projection optical system PL, and corrected the design data that should be supplied (input) to mask device 12 according to the analyzed results. However, as well as this, a pattern image formed on plate P with pattern detection system 44 or 46 previously described, such as, for example, a resist image, can be picked up, and based on the imaging result, pattern data generation device 32 can analyze the pattern image and correct the design data that should be supplied (input) to mask device 12 according to the analyzed results. Further, instead of a resist image, the latent image previously described or an image which can be obtained by applying etching can be analyzed.

In the embodiment above, while the case has been described where exposure apparatus 100 is equipped with all three of image detector 42, and pattern detection systems 44 and 46 as the detection devices of the pattern image (including a projected image, a resist image and the like), exposure apparatus 10C can be equipped with at least one of the three devices. Incidentally, the device (pattern detection systems 44, 46 and the like) detecting a pattern image (such as a resist image) formed on the plate previously described is not limited to a device by the image processing method, and for example, a device using a method that detects diffraction light or scattered light generated from a resist image by irradiation of a detection light can also be used.

Further, in the embodiment above, while scanning exposure of plate P is performed scrolling a pattern generated in variable shaped mask VM while plate P is scanned in the Y-axis direction with respect to projection optical system PL, exposure apparatus 100 can employ a step-and-stitch method (a scan-and-scan method) or a step-and-repeat method (step-and-scan method) in which plate P is stepped in the X-axis direction after the end of scanning exposure and scanning exposure of plate P is performed by scrolling the pattern generated in variable shaped mask VM while plate P is scanned again in the Y-axis direction. With the step-and-stitch method, it is possible to form a pattern of a large area on plate P, and with the step-and-repeat method, it is possible to form a pattern in each of a plurality of divided areas on plate P.

A Second Embodiment

Next, a second embodiment of the present invention will be described below, with reference to FIG. 5. The exposure apparatus related to the second embodiment differs only in the configuration of a part of the illumination optical system and the projection optical system, and in the placement mask holder 28 and variable shaped mask VM from the first embodiment previously described, and the configuration and the like of other sections are the same or similar to the first embodiment previously described. Accordingly, from the viewpoint of avoiding redundancy, the description below will be made focusing on the difference, and the same reference numerals will be used for the same or similar sections and a detailed description thereabout will be omitted.

Figure 5:
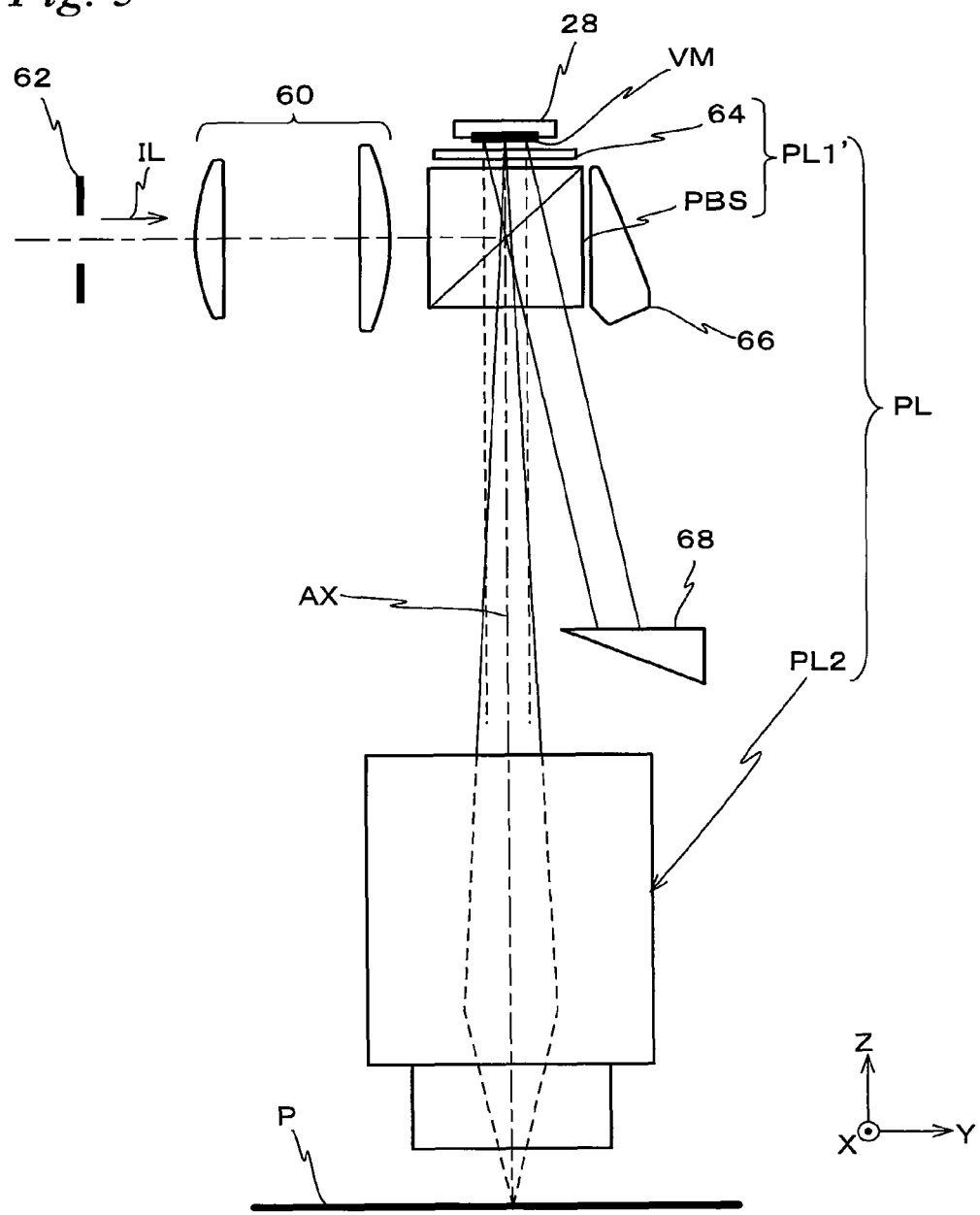
FIG. 5 is a view that schematically shows a configuration of an exposure apparatus related to a second embodiment.

FIG. 5 shows a configuration of a projection optical system PL that configures an exposure apparatus of the second embodiment. Projection optical system PL has a single optical axis AX parallel to the Z-axis direction, and is a both-side telecentric catodioptric system including a polarization beam splitter PBS whose separation plane forms an angle of 45 degrees to the XY plane. Incidentally, FIG. 5 shows a part of illumination optical system 24 (refer to FIG. 1, in this example, mirror M and condensing lens 26 in FIG. 1 are not included), or more specifically, a field stop 62 which sets an irradiation area (illumination area) of illumination light IL on variable shaped mask VM, and a lens system 60. Field stop 62 is placed approximately conjugate with the surface (placement surface of the micro mirror) of variable shaped mask VM with respect to lens system 60 in this example.

In the second embodiment, variable shaped mask VM is held by mask holder 28 so that its surface (when all the mirrors are in an ON state) is placed substantially parallel to the XY plane, and can be finely moved within the XY plane by mask holder 28. Incidentally, as in the first embodiment above, variable shaped mask VM can be moved along the Z-axis direction, and/or can be made tiltable with respect to the XY plane.

Projection optical system PL includes a first partial optical system PL1' including a quarter-wave plate (hereinafter briefly referred to as a "$\lambda/4$ plate") 64, which is placed parallel to the XY plane and also serves as a part of illumination optical system 24, and polarization beam splitter PBS, and a second partial optical system PL2 that has an optical axis AX common with the first partial optical system PL1'.

On the +Y side of polarization beam splitter PBS in FIG. 5, a light trap 66 is placed. Further, at a position on the lower right side of polarization beam splitter PBS in FIG. 5, another light trap 68 is placed.

The linearly polarized light which was incident on illumination optical system 24 from light source system 22 (not shown in FIG. 5, refer to FIG. 1), such as, for example, S-polarized illumination light IL, is incident on polarization beam splitter PBS via field stop 62 and lens system 60. Then, after being reflected by polarization beam splitter PBS, illumination light IL passes through $\lambda/4$ plate 64 and becomes a circular polarized light, which is incident on variable shaped mask VM.

Illumination light IL is reflected in the −Z direction by micro mirrors which are in an ON state among many micro mirrors within the illumination area of variable shaped mask VM, and becomes a circular polarized light in a direction reversed from before and passes through $\lambda/4$ plate 64 again, and is incident on polarization beam splitter PBS as a linearly polarized light whose polarization direction is different from the time of incidence, or more specifically, as a P-polarized light. Then, the P-polarized illumination light IL that goes through polarization beam splitter PBS is incident on the second partial optical system PL2, and is projected on plate P having a resist applied to its surface via the second partial optical system PL2. In the manner described above, by projection optical system PL, the pattern of variable shaped mask VM illuminated by illumination light IL is reduced and projected within an exposure area (a projection area conjugate with the illumination area) on plate P placed on a surface (image plane) subject to exposure at a projection magnification $\beta$ ($\beta$, for example, is 1/500).

Meanwhile, illumination light IL which was incident on micro mirrors in an OFF state in the illumination area on variable shaped mask VM is reflected outside the exposure optical path by the micro mirrors, or more specifically, in the lower right side direction in FIG. 5, and passes through $\lambda/4$ plate 64 and polarization beam splitter PBS and then is absorbed at light trap 68.

Incidentally, while almost all of the S-polarized illumination light IL is reflected off polarization beam splitter PBS, a small amount goes through. Light trap 66 is arranged to absorb illumination light IL which has gone through polarization beam splitter PBS.

The configuration and the like of other sections are similar to the first embodiment previously described.

Accordingly, with the exposure apparatus related to the second embodiment, an equal effect as in the first embodiment previously described can be obtained. In addition, in the exposure apparatus related to the second embodiment, because the incidence angle of illumination light IL to the reflection type variable shaped mask VM can be 90 degrees, projection optical system PL which is both sides telecentric, or more specifically, which is telecentric on the image plane side (the plate side) and the object plane side (the mask side) can be used, and the imaging performance of exposure apparatus can be improved.

Incidentally, in the first embodiment above, instead of beam splitter BS previously described, a polarization beam splitter and a λ/4 plate can be arranged as in the second embodiment. In this case, light quantity loss in projection optical system PL can be largely suppressed.

Further, in each of the embodiments above, the exposure apparatus does not have to be equipped with pattern data generation device 32. In this case, main controller 20 can perform correction of the pattern data based on, for example, mask pattern information (display data) which is to be generated in variable shaped mask VM acquired from an external device (equivalent to a pattern data generation device or its upper device), and the detection results of the pattern image previously described. Or, main controller 20 can perform detection of a pattern image previously described, and the pattern data correction can be performed by the external device. As a matter of course, the same can be said for correction of not only pattern data, but also for illumination condition, exposure amount, and image-forming characteristics previously described.

Incidentally, in each of the embodiments above, while the pattern image (such as the resist image) formed on the plate was detected using pattern detection systems 44 and 46 of the exposure apparatus, a device besides the exposure apparatus, such as for example, a device used exclusively for measurement (e.g., a registration measuring machine, wafer inspection device and the like) can be used to detect the pattern image on the plate. In this case, the correction of the pattern data can be performed by the device used exclusively for measurement based on its measurement result and the mask pattern information previously described, or the measurement results can be sent to other devices (for example, the external device described above, main controller 20 or the like) via a communication channel or the like, and correction of the pattern data can be performed by other devices.

Further, even if the pattern size such as, for example, the line width, of the resist image formed on the plate by going through exposure and development processing is at a target line width, the line width of the pattern formed on the plate by further going through cure (heating) and etching process can turn out to be different from the target line width. Therefore, the pattern image formed after etching can be detected rather than the latent image or the resist image previously described, and the detection results can be used in the correction of the pattern data previously described. Or, line width characteristics of the pattern image can be obtained in advance by simulation or experiment and the like, and in the correction of the pattern data previously described, detection results of the pattern image (any one of the projected image, the latent image and the resist image) and the line width characteristics can be used when correcting the pattern data previously described. In this case, it is desirable to predict a pattern profile of the resist image formed on the plate, for example, based on a sharp-edged feature (a derivative or a log slope at a predetermined position in an image intensity distribution of the projection image, or contrast of the projected image) of the projected image of the pattern generated in the variable shaped mask, and also to predict the device line width characteristics based on the pattern profile. Furthermore, it is desirable to predict the pattern profile taking into consideration deformation of the resist image caused by heat treatment, and the device line width characteristics is preferably predicted taking into consideration the etching characteristics.

Incidentally, in each of the embodiments above, while the correction of the pattern data was performed based on the detection results of the pattern image (the projected image, the resist image and the like), the detection results can be used, for example, to perform confirmation and the like of the operating state of the micro mirrors of variable shaped mask VM. To be concrete, in the case a micro mirror that should be in an ON state at the time of projection of the pattern generated in variable shaped mask VM is in an OFF state, a defect occurs in a part of the pattern image by the malfunctioning micro mirror. This pattern defect can be specified from comparing the detection results of the pattern image and the mask pattern information previously described, and based on the pattern defect which has been specified, the malfunctioning micro mirror can be obtained. In this case, the variable shaped mask can be replaced, or variable shaped mask VM and the illumination area previously described can be relatively moved so that the malfunctioning micro mirror is no longer located within the illumination area.

Further, in each of the embodiments above, while the transfer pattern is formed by switching on/off each element (such as the micro mirror) of variable shaped mask (electronic mask) VM, as well as switching on/off each element of the variable shaped mask, a halftone of each element can be used to form the pattern. In the case of using, for example, a transmission type liquid crystal mask as the variable shaped mask, by performing a halftone drive of each element of the variable shaped mask, the illuminance of the illumination light can be made substantially uniform even if the illuminance of the illumination light on the variable shaped mask is uneven. Accordingly, it becomes possible to correct the unevenness of the illuminance distribution of the illumination light which occurs due to the optical properties (such as aberration) of the illumination optical system or aged deterioration, or as a consequence, the unevenness of the pattern image line width.

Incidentally, in each of the embodiments above, while the size (line width) was obtained as a characteristic of the pattern image, the image characteristic is not limited to the size, and for example, contrast and the like can also be obtained.

Further, while stage ST was made stationary at the time of detection of the pattern image, the pattern image can be detected with image detector 42 while the ON/OFF operation of each micro mirror of variable shaped mask VM and the movement of stage ST are synchronized during the generation of the pattern image, or an image (such as a resist image) which is obtained when a transfer onto the plate is performed can be detected.

Furthermore, while a CCD was used as a photodetection element of image detector 42 previously described, for example, a TDI (Time Delay and Integration) sensor and the like can be used instead. Further, while at least a part of image detector 42 previously described was arranged in stage ST, a part of or all of image detector 42 can be arranged in a movable body separate from stage ST. The separate movable body can be a measurement stage that has a measurement member (a reference mark, a sensor and the like) whose details are disclosed in, for example, Kokai (Japanese Patent Unexamined Application Publication) No. 11-135400 bulletin (the corresponding pamphlet of International Publication No. 1999/23692), Kokai (Japanese Patent Unexamined Application Publication) No. 2000-164504 bulletin (the corresponding U.S. Pat. No. 6,897,963 description) are preferable.

Further, in each of the embodiments above, while the exposure apparatus is equipped with only one set of variable shaped mask VM and projection optical system PL, for example, a plurality of sets of variable shaped mask VM and projection optical system PL can be arranged in which the exposure area is placed in the non-scanning direction (the X-axis direction). Incidentally, while the illumination optical system previously described is equipped with a field stop, for example, the irradiation area (corresponding to the exposure area previously described) of illumination light IL on the plate can be substantially set by the ON/OFF operation of each micro mirror of the variable shaped mask, without arranging the field stop.

Incidentally, in each of the embodiments above, while the exposure apparatus is equipped with a DMD which is a non-emission type image display device serving as a variable shaped mask (an active mask, an image generator), the variable shaped mask is not limited to the DMD and instead of the DMD, the non-emission type image display device described below can also be used. The non-emission type image display device, here, is also called a spatial light modulator (SLM: Spatial Light Modulator), and is a device which spatially modulates the amplitude (intensity), the phase, or the state of polarization of the light which travels in a predetermined direction, and as a transmission type spatial light modulator, an electrochromic display (ECD) and the like can be given as an example besides the transmission type liquid crystal display device (LCD: Liquid Crystal Display). Further, as a reflection type spatial light modulator, besides the DMD described above, a reflection mirror array, a reflection type liquid crystal display device, an electrophoretic display (EPD: Electro Phonetic Display), an electronic paper (or electronic ink), a light diffraction type light valve (Grating Light Valve) and the like can be given as an example.

Incidentally, in the case the variable shaped mask is configured using a reflection type non-emission type image display device, as the projection optical system, a reflection system can also be used besides the catodioptric system previously described. Further, in the case the variable shaped mask is configured using a transmission type non-emission type image display device, not only a catodioptric system and a reflection system, but also a refraction system can be used as the projection optical system.

Further, the exposure apparatus in each of the embodiments above can be equipped with a pattern generation device including a spontaneous light emitting type image display device, instead of the variable shaped mask equipped with the non-emission type image display device. In this case, the illumination system will not be necessary. As the spontaneous light emitting type image display device here, for example, a CRT (Cathode Ray Tube), an inorganic EL display, an organic EL display (OLED: Organic Light Emitting Diode), an LED display, an LD display, a field emission display (FED: Field Emission Display), a plasma display (PDP: Plasma Display Panel) and the like can be given. Further, a solid light source chip having a plurality of light emitting points, a solid light source chip array in which a plurality of chips are arranged in an array, or a device of a type in which a plurality of light emitting points is made into a single substrate and the like can be used as the spontaneous light emitting type image display device equipped in the pattern generation device, and the pattern can be formed by electrically controlling the solid light source chip. Incidentally, no distinction is made between inorganic and organic solid light source elements.

Incidentally, when the exposure apparatus is equipped with the pattern generation device including the spontaneous light emitting type image display device, in the case of using a projection optical system or an image-forming optical system, not only the catodioptric system or the reflection system, but also the refraction system can be used as the optical system.

Further, the projection optical system equipped in the exposure apparatus of the present invention is not limited to a reduction system, and can also be an equal magnifying system or a magnifying system. Furthermore, the projected image generated in the projection area of the projection optical system can be either an inverted image or an erected image.

Incidentally, as is disclosed in, for example, the pamphlet of International Publication No. 99/49504, IP patent Application Publication No. 1,420,298 description, the pamphlet of International Publication No. 2004/055803, Kokai (Japanese Patent Unexamined Application Publication) No. 2004-289126 bulletin (corresponding U.S. Pat. No. 6,952,253 description) and the like, the present invention can be applied to an exposure apparatus in which a liquid immersion space including an optical path of an illumination light is formed between a projection optical system and a plate, and the plate is exposed by the illumination light via the projection optical system and the liquid in the liquid immersion space.

Further, the present invention can also be applied to a multi-stage type exposure apparatus equipped with a plurality of wafer stages, as is disclosed in, for example, Kokai (Japanese Unexamined Patent Application Publication) No. 10-163099 and No. 10-214783 bulletins (the corresponding U.S. Pat. No. 6,590,634 description), Kohyo (published Japanese translation of International Publication for Patent Application) No. 2000-505958 bulletin (the corresponding U.S. Pat. No. 5,969,441 description), the U.S. Pat. No. 6,208,407 description, and the like.

Moreover, as is disclosed in, for example, Kohyo (published Japanese translation of International Publication for Patent Application) No. 2004-519850 bulletin, the corresponding U.S. Pat. No. 6,611,316 description and the like, the present invention can also be applied to an exposure apparatus that synthesizes patterns generated respectively in a plurality of variable shaped masks on a plate via a projection optical system, and almost simultaneously performs double exposure of one area on the plate by one scanning exposure.

Incidentally, the exposure apparatus in each of the embodiments above can be made by incorporating the illumination optical system made up of a plurality of optical elements and the projection optical system into the main section of the exposure apparatus, and along with the optical adjustment operation, parts such as the variable shaped mask (mask device) previously described and the stage made up of multiple mechanical parts are also attached to the main section of the exposure apparatus and the wiring and piping connected, and then by performing total adjustment (such as electrical adjustment and operation check). Incidentally, the making of the exposure apparatus is preferable performed in a clean room where the temperature, the degree of cleanliness and the like is controlled.

Further, the application of the present invention is not limited to the manufacturing process of semiconductor devices, and for example, the present invention can also be widely applied to the manufacturing process of various devices such as the manufacturing process of display devices such as a liquid crystal display device or a plasma display, an imaging device (CCD), a micro machine, a MEMS (Microelectromechanical Systems: minute electric machine systems), a thin film magnetic head that uses a ceramics wafer as a substrate, the DNA chip and the like. Furthermore, the present invention can also be applied to a manufacturing process when a mask (such as a photomask or a reticle) on which the mask pattern of various devices is formed is manufactured, using a photolithography process.

Furthermore, in the present invention, the object (plate) subject to exposure is not limited to wafers, and other objects can also be used such as glass plates, ceramic substrates, film members or mask blanks, and the shape is also not limited to a circular shape and can be a rectangular shape.

Incidentally, as long as the national laws in designated states (or elected states), to which this international application is applied, permit, the above disclosures of all the publications (including the pamphlet of the International Publications) and the U.S. patents related to the exposure apparatus quoted in each of the embodiments above and in the modified examples are incorporated herein by reference.

Device Manufacturing Method

Figure 6:
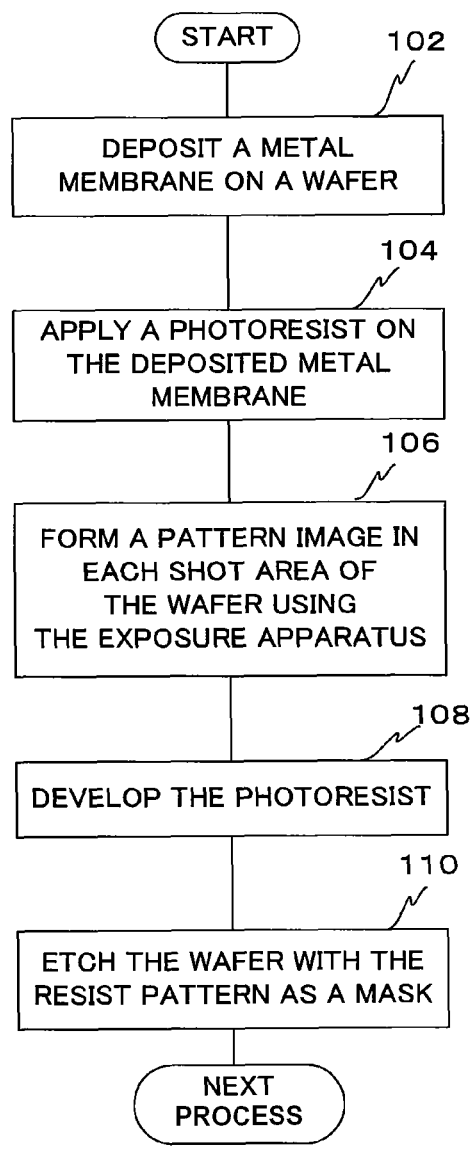
FIG. 6 is a flow chart which is used to explain a device manufacturing method of a semiconductor device serving as a micro device.

Next, a manufacturing method of a micro device which uses the exposure apparatus of the first and second embodiments above in a lithography process will be described. FIG. 6 is a flow chart for describing a manufacturing method of a semiconductor device serving as a micro device.

First of all, in step 102 of FIG. 6, a metal membrane is deposited on a wafer (a plate) of one lot. In the next step, step 104, a photoresist is applied on the metal membrane on the wafer (a plate) of the one lot. Then, in step 106, using the exposure apparatus in the first and second embodiments above, the image of the pattern generated in variable shaped mask VM based on the design data corrected in pattern data generation device 32 is sequentially projected on each shot area on the wafer (the plate) of the one lot, via projection optical system PL. More specifically, each shot area on the wafer (the plate) is sequentially exposed with the pattern image.

Then, in step 108, after development of the photoresist on the wafer (the plate) in the one lot was performed, in step 110, by performing etching on the wafer (the plate) of the one lot with the resist pattern serving as a mask, a circuit pattern corresponding to the pattern generated in variable shaped mask VM is formed in each shot area on each wafer (the plate).

Then, by performing circuit pattern formation and the like further on the layers above, a device such as a semiconductor device and the like is manufactured. Accordingly, the image of the pattern generated in variable shaped mask VM based on the design data corrected in pattern data generation device 32, or in other words, the pattern image having a desired line width can be formed with good precision, and as a result, devices such as a semiconductor device can be manufactured with good yield.

Further, in the exposure apparatus related to the first and second embodiments above, by forming a predetermined pattern (such as a circuit pattern or an electrode pattern) on a plate (a glass substrate), a liquid crystal display device serving as a micro device can be obtained. FIG. 7 is a flow chart for describing a method to manufacture a liquid crystal display device serving as a micro device by forming a predetermined pattern on a plate using the exposure apparatus of the first and second embodiments.

In the pattern formation process of step 202 in FIG. 7, the so-called optical lithography process is executed in which the image of the pattern generated in variable shaped mask VM based on the design data corrected in pattern data generation device 32 is formed on a photosensitive substrate (such as a glass substrate to which a resist is applied) via projection optical system PL, using the exposure apparatus of the first and second embodiments. By the optical lithography process, a predetermined pattern including a large number of electrodes or the like is formed on the photosensitive substrate. Then, the substrate which has been exposed goes through each process such as a developing process, an etching process, a resist stripping process and the like, and a predetermined pattern is formed on the substrate.

Next, in color filter formation process in step 204, a group of three dots corresponding to R (Red), G (Green), and B (Blue) are arranged in numbers in the shape of a matrix, or a color filter is formed in which a group of three stripe filters, R, G, and B are arranged in plural numbers in a horizontal scanning line direction. Then, after the color filter formation process (step 204), a cell assembly process in step 206 is executed. In the cell assembly process in step 206, a liquid crystal panel (a liquid crystal cell) is assembled using the substrate having a predetermined pattern obtained in the pattern formation process, and the color filter obtained in the color filter formation process.

In the cell assembly process in step 206, a liquid crystal panel (a liquid crystal cell) is manufactured, for example, by pouring a liquid crystal into a space formed between the substrate having the predetermined pattern obtained in the pattern formation process and the color filter obtained in the color filter formation process. Then, in a module assembly process in step 208, parts such as an electric circuit which makes the liquid crystal panel (liquid crystal cell) that has been fabricated perform a display operation, a backlight and the like are attached to the panel, and is made complete as a liquid crystal display device. Accordingly, in the pattern formation process of the manufacturing method of the micro device, the image of the pattern generated in variable shaped mask VM based on the design data corrected in pattern data generation device 32, or in other words, the pattern image having a desired line width can be formed with good precision, and as a result, a liquid crystal display device can be manufactured with good yield.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. A device manufacturing method comprising:
   forming a pattern image by using a spatial light modulator to which an illumination light is irradiated, based on data corresponding to a device pattern;
   detecting the pattern image that has been formed;
   correcting the data corresponding to the device pattern by using a result of the detection, when quality of the pattern image varies from a predetermined specification; and
   exposing a substrate with a radiation image formed by the spatial light modulator based on the data that has been corrected, wherein
   the quality of the pattern image includes an absolute value of a line width error of the pattern image.

2. The method according to claim 1, wherein
the pattern image is an aerial image that is generated on an image plane of a projection system by the projection system having an object plane on which the spatial light modulator is placed.

3. The method according to claim 2, wherein
the pattern image is detected by a detection system of an exposure apparatus that has the spatial light modulator and the projection system.

4. The method according to claim 1, wherein
in the forming the pattern image,
a detection system is provided whose photodetection surface is placed on an image plane of a projection system having an object plane on which the spatial light modulator is placed,
a pattern image is generated on the photodetection surface with the spatial light modulator and the projection system, and
the pattern image is detected with the detection system.

5. The method according to claim 1, wherein
the pattern image is an image that is formed on an object by exposing the object with the illumination light from the spatial light modulator.

6. The method according to claim 5, wherein
the pattern image is detected by a detection system of an exposure apparatus that has the spatial light modulator.

7. The method according to claim 5, wherein
the pattern image is detected by a measurement device different from an exposure apparatus that has the spatial light modulator.

8. The method according to claim 1, wherein
in the forming the pattern image,
an object is placed on an image plane of a projection system having an object plane on which the spatial light modulator is placed,
the object is exposed with a pattern image that is generated via the spatial light modulator and the projection system, and
the pattern image that has been formed on the object by the exposure is detected.

9. The method according to claim 1, further comprising:
changing an exposure condition of the substrate based on the result of the detection.

10. The method according to claim 1, wherein
the correction is performed so that a size of at least a part of the device pattern is changed.

11. The method according to claim 1, wherein
the device pattern has an auxiliary pattern used in optical proximity correction, and
in the correction, at least one of a size and a position of the auxiliary pattern is changed.

12. The method according to claim 1, wherein
in the correction, correction of the data based on the result of the detection is performed, and
the exposure is performed with a pattern image, which is generated by the spatial light modulator based on the data that has been corrected, serving as the radiation image of the device pattern that has been corrected.

* * * * *